(12) United States Patent
Ragan et al.

(10) Patent No.: US 6,188,288 B1
(45) Date of Patent: Feb. 13, 2001

(54) FULLY INTEGRATED DIGITAL FREQUENCY SYNTHESIZER

(75) Inventors: Lawrence H. Ragan, Richardson, TX (US); Mark R. Gehring, Portland, OR (US)

(73) Assignee: RadioCom Corporation, Portland, OR (US)

(*) Notice: Under 35 U.S.C. 154(b), the term of this patent shall be extended for 0 days.

(21) Appl. No.: 09/229,063

(22) Filed: Jan. 12, 1999

(51) Int. Cl.[7] ............... H03L 7/085; H03L 7/18; H03L 7/197

(52) U.S. Cl. ............... 331/16; 331/17; 331/25; 331/34

(58) Field of Search ............... 331/1 A, 17, 25, 331/34, 16

(56) References Cited

U.S. PATENT DOCUMENTS 5,182,528 * 1/1993 Zuta ........................ 331/1 A
5,459,435 * 10/1995 Taki ........................ 331/1 A
5,999,060 * 12/1999 Zuta ........................ 331/14

OTHER PUBLICATIONS

Zuta, "A New PLL With Fast Settling Time And Low Phase Noise", Microwave Journal, vol. 41, No. 6, Jun. 1998, pp. 94, 96, 98, 100, 102, 104, 106, 108.*

* cited by examiner

Primary Examiner—Siegfried H. Grimm
(74) Attorney, Agent, or Firm—Suiter & Associates PC

(57) ABSTRACT

A frequency synthesizer apparatus is disclosed which combines a digital multiplier in the count down and phase comparison section with an oscillator entirely contained on an integrated circuit. Inclusion of the digital multiplier allows simultaneous realization of high loop bandwidth and fast tuning speed. The large loop bandwidth facilitates use of a totally integrated oscillator, which was heretofore not useable because of inferior phase noise characteristics. An integrated filter further enhances loop bandwidth while maintaining stability. Synchronizing the modulus switching of a multi-modulus prescaler with the multiplier coefficient minimizes spurious responses in the synthesized output.

10 Claims, 2 Drawing Sheets

FULLY INTEGRATED DIGITAL FREQUENCY SYNTHESIZER

CROSS-REFERENCE TO RELATED APPLICATIONS (Not Applicable)

STATEMENT REGARDING FEDERALLY SPONSORED RESEARCH OR DEVELOPMENT

This invention did not result in any way from funding or sponsorship of any governmental entity, including the Federal Government of the United States of America.

BACKGROUND OF THE INVENTION

This invention relates to digital frequency synthesizers, and more specifically to such synthesizers which are implemented using a minimum number of electronic components.

Phase locked loop digital frequency synthesizers are used in radio frequency receivers and transmitters to generate a signal whose frequency is precisely controlled. A variable frequency oscillator is controlled with a feedback system consisting of a variable modulus prescaler driven by the oscillator, which in turn drives a programmable digital divider. The output of the programmable digital divider is compared in a phase detector with the output of a reference oscillator and (in some cases) a reference frequency digital divider. The output of the phase detector is filtered to provide the frequency control signal for the oscillator, typically a voltage applied to a diode to control its capacitance. The diode is resonated with an inductor, forming a tuned circuit which controls the frequency of the variable frequency oscillator. The frequency of the synthesizer is changed by changing the effective divide ratio between the variable frequency oscillator and the phase detector, controlled by the modulus of the prescaler and the modulus of the programmable divider. The filter must perform two functions; first, to remove high frequency components of the phase detection process and second, to stabilize the control loop. These requirements are often in conflict. Unwanted spectral components from the filter frequency modulate the variable oscillator, resulting in spurious modulation sidebands which limit the usefulness of the synthesizer system. Controlling these unwanted signal components by lowering the cutoff frequency of the filter reduces the tuning speed.

The phase noise of a synthesizer is dominated by the reference oscillator for modulation or offset frequencies well inside the loop bandwidth of the control system, and by the variable frequency oscillator for frequencies outside the loop bandwidth of the control system. If tuning speed or spurious suppression are not considered, the loop bandwidth is selected equal to the frequency where the noise from these two contributors are equal, thus optimizing the phase noise performance. Variable oscillators with poor noise characteristics could be utilized in many systems by selecting a high loop bandwidth. Such designs are precluded by limitations in the design of the loop filter. Filter bandwidths sufficient to optimize the noise performance result in unacceptable spurious levels from products of the phase detector. This impasse could be broken, in concept, with a more complex, non-minimum phase or higher order loop filter. Use of more complex analog loop filters has proven tedious, with unattractive cost/benefit ratios. Substituting a digital adder and analog to digital converter for the phase detector, and rationalizing the counter outputs of the programmable and reference counters by including a digital multiplier can favorably impact this design tradeoff. (Zuta, Marc—"A New PLL with Fast Settling Time and Low Phase Noise" Microwave Journal, June, 1998 Published by Horizon House Publications 685 Canton Street, Norwood Mass. 02602 (USPS 396-250) This topology also provides the opportunity to impact the loop filter design problem with a digital filter between the digital adder and the digital to analog converter. U.S. Pat. No. 5,182,528 teaches another method, wherein the characteristics of the oscillator are modified to include both digital and analog controls, and the oscillator tuning characteristics are stored in a computer, so the correct tuning voltage and digital signal can be anticipated, thus reducing the tuning time. While this solution can improve the tuning time, it does not address the phase noise compromises.

The oscillator as described above presents other difficulties, as well. The inductor necessarily creates magnetic fields which can leak to other parts of the circuit or the antenna, causing undesired interference to the equipment containing the synthesizer or, through the antenna, other equipment at a distance. Further, in order to tune wide frequency ranges, such as the octave or more required by the digital satellite service, for example, voltages larger than required for the rest of the circuitry are used, requiring an additional power supply. In some applications, outputs from the oscillator are required to be in phase quadrature, which requires additional circuitry to generate. These difficulties are obviated with a fully integrated, current controlled delay oscillator ([1]Johan van der Tang and Dieter Kasperkovitz, "A 0.9–2.2 GHz Monolithic Quadrature Mixer Oscillator for Direct Conversion Satellite Receivers", in IEEE ISSCC Digest of Technical Papers, 1997, pp. 88–89), but this oscillator has not found use because its high phase noise requires loop bandwidths inconsistent with typical tuning speed and spurious modulation sideband requirements.

Until the present invention, there has not been a means to meet the phase noise, spurious suppression, and tuning speed requirements with synthesizers utilizing fully integrated oscillators for use in modern communication systems, such as direct broadcast satellite receivers.

BRIEF SUMMARY OF THE INVENTION

The principal object of the invention is to provide a fully integrated synthesizer with adequate phase noise, spurious modulation sideband suppression, and tuning speed. Another object of the invention is to reduce oscillator radiation to other equipment and self interference to the equipment which contains the synthesizer. Another object of the invention is to reduce the power consumption of synthesizers. Other objects of the invention are to reduce the manufactured cost, physical size, and rate of failure of synthesizers by reducing the component count. These objects can be accomplished by adding a digital filter, and, if necessary, a multi-modulus prescaler to a synthesizer architecture similar to that described by Zuta to control a fully integrated variable frequency oscillator such as the one described by Tang and Kasperkovitz. Further objects, advantages and other features of the present invention will become obvious to those skilled in the art upon reading the disclosure set forth hereinafter.

DETAILED DESCRIPTION OF THE INVENTION

Figure 1:
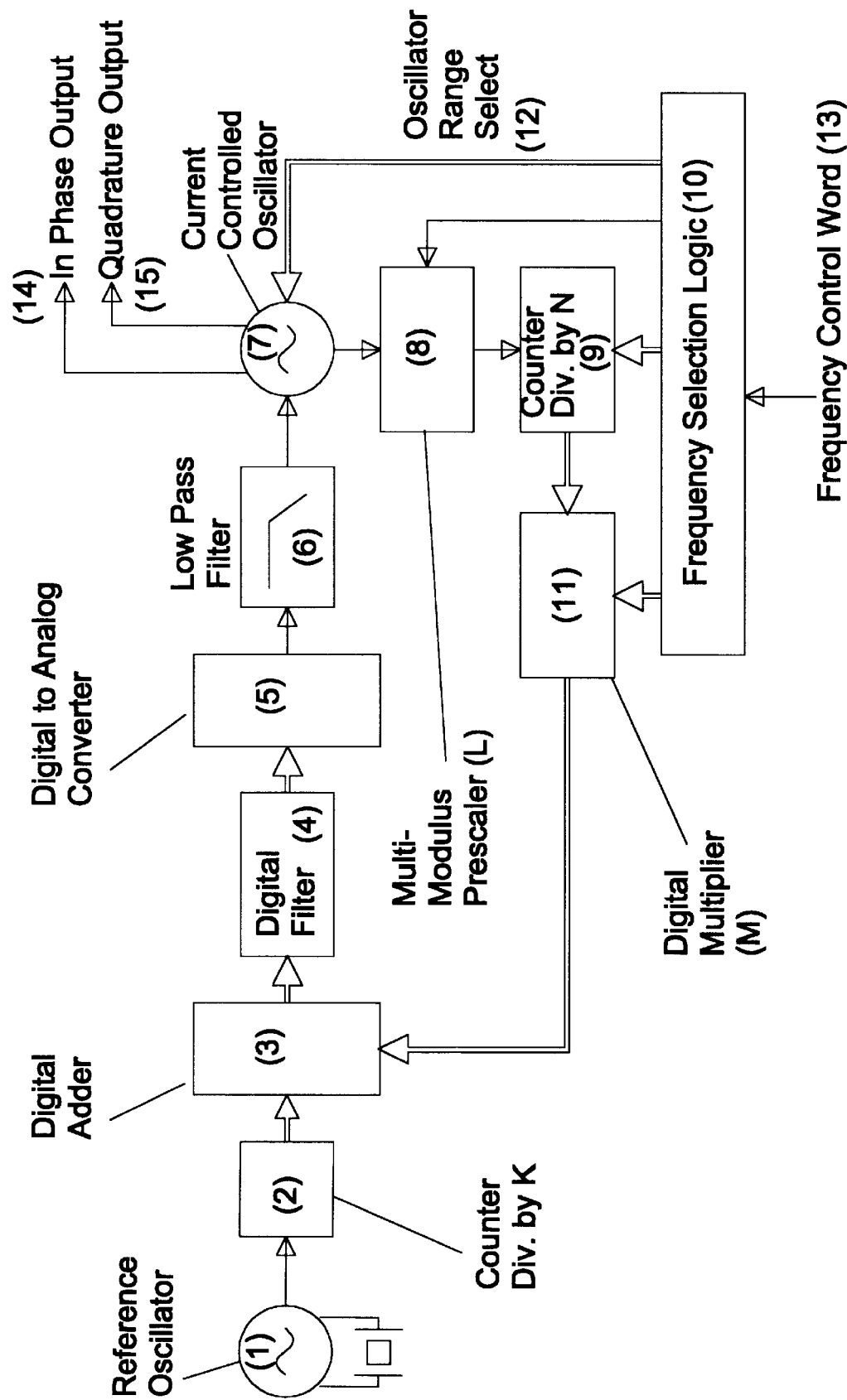
FIG. 1 is a block diagram of the Fully Integrated Digital Frequency Synthesizer.

A preferred embodiment of the frequency synthesizer invention will now be described by way of example, and with reference to the accompanying drawings. Referring to FIG. 1, Reference Oscillator 1, whose frequency is typically controlled by a stable high Q resonator, typically made of quartz, provides a repetitive waveform at reference frequency Fref which drives digital counter ("counter") 2. Counter 2 receives its input from the reference oscillator and divides the reference frequency by its modulus k. The digital output of counter 2 is a representation of the number of cycles of the reference oscillator which have occurred since the start of the synthesis cycle. For purposes of illustration, assume the reference frequency Fref is chosen to be 32 MHz, and k is chosen to be $2^5=32$. Counter 2 is then a 5-bit counter, with 5 binary output lines. The number represented by the output of counter 2 increases incrementally from 0 to 31, with each number in the sequence dwelling for 1/Fref= 31.25 nanoseconds. The number then goes to zero and the synthesis cycle repeats, with a period of k/Fref=1 microsecond. The step size, or tuning increment, of the synthesizer is S=Fref/k=1 MHz. Note that the example chosen does not require counter 2 to be reset at the end of each synthesis cycle. Choice of modulus k for counter 2 not equal to a power of 2 would require a preset or reset operation to ready the counter for the next synthesis cycle.

The output from counter 2 is combined, in digital adder ("adder") 3, with the output from Digital Multiplier ("DM") 11. DM 11 receives input from counter 9 which is programmed from Frequency Selection Logic ("FSL") 10. Counter 9 receives its input from Multi-Modulus Prescaler ("MMP") 8. MMP 8 receives input from Current Controlled Oscillator ("CCO") 7 and modulus control from FSL 10. CCO 7 receives frequency control input from Low Pass Filter ("LPF") 6, which receives input from Digital to Analog Converter ("DAC") 5 and drives variable frequency oscillator CCO 7. DAC 5 receives its input from Digital Filter ("DF") 4, which receives input from adder 3. Alternative implementations of the invention eliminate DF 4, so DAC 5 receives input directly from adder 3. The digital output of DM 11 represents the product of the output of counter 9 and an electronically selectable multiplication factor M. DM 11 receives multiplication factor M from FSL 10. MMP 8 is included for convenience in conserving current at high output frequencies ("Fo") of the synthesizer, and may be omitted in some implementations of the invention. If MMP 8 is omitted, counter 9 receives input directly from CCO 7. All combinations including or excluding MMP8 and DF 4 are feasible. The digital output of counter 9 represents the number of cycles of the input to counter 9 since the beginning of the synthesis cycle. Adder 3 receives one input from counter 2 and the other input from DM 11. The digital output of adder 3 represents the difference between the input it receives from counter 2 and the input it receives from DM 11.

Changing the modulus L during the synthesis cycle allows a non-integer relationship between the output frequency Fo and the step size S. The design of dual and triple modulus prescalers is well understood by those skilled in the art of synthesizer design, and will not be elaborated here.

Figure 2:
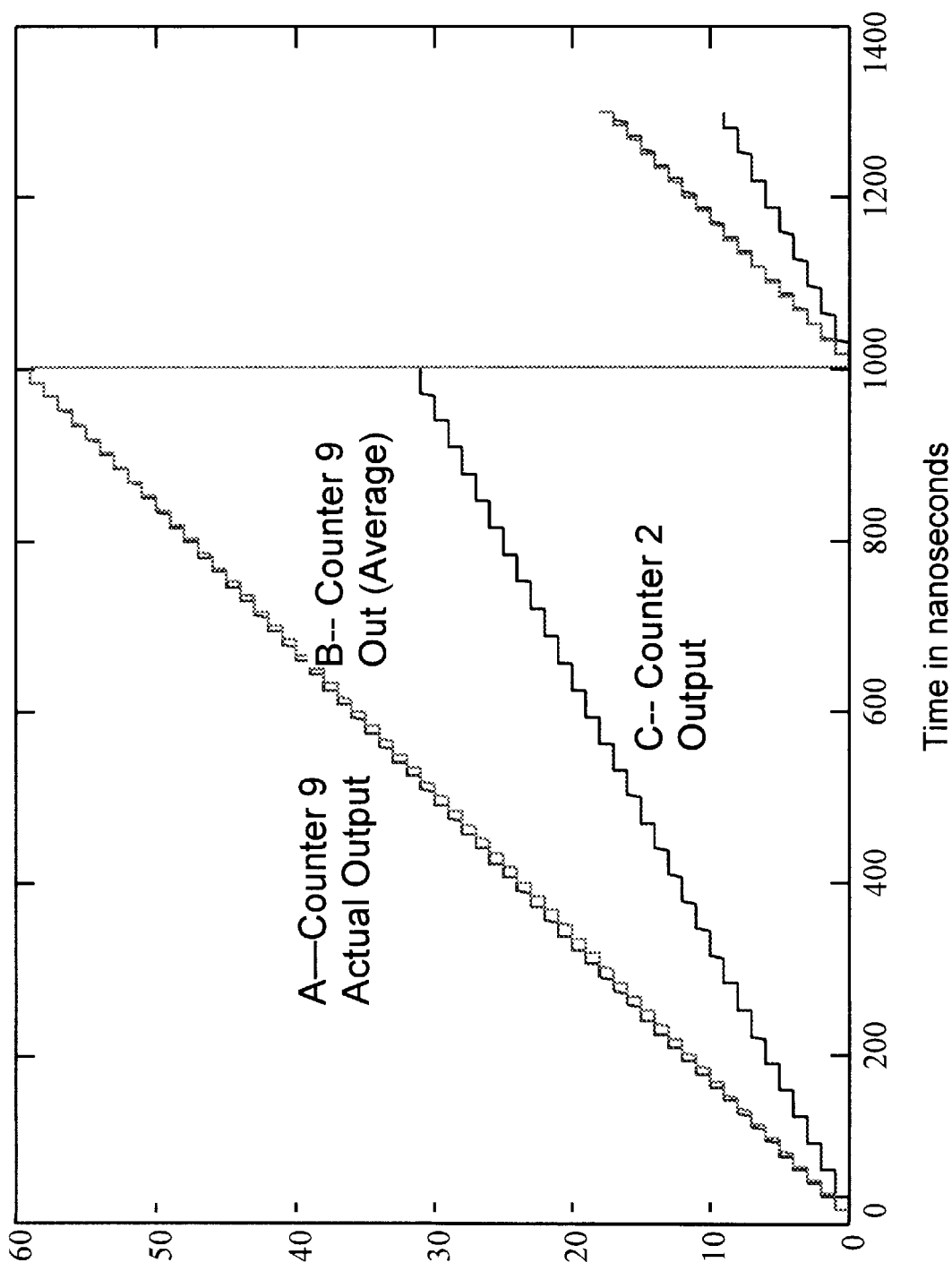
FIG. 2 is a time diagram showing the outputs of the digital counters for the illustrative example over one complete synthesis cycle and a portion of a second.

Counter 9 can be one of two types that provide division by an electronically selectable division ratio ("N" in FIG. 1). One common type of programmable divider typically consists of a counter which is preset with the complement of the desired count N at the beginning of a synthesis cycle, and allowed to "count down" to zero at the end of the synthesis cycle (type 1). The second type of programmable counter starts from a count of zero at the beginning of the synthesis cycle and is reset when the count reaches the programmed value (type 2). The second type of counter (type 2) is assumed for the example design shown in FIGS. 1 and 2. If type 1 counter is used, the output of counter 9 would not be as shown in FIG. 2, but would start at the preset number (59 for the example shown) and count down to zero. Either type of counter can be accommodated with a change in sign of the multiplication factor M as provided to DM 11 by FSL 10. FSL 10 would be modified to properly drive a type 1 or type 2 counter as appropriate.

DM 11 is of common construction, well known to those skilled in the art of digital signal processing. With careful selection of the other system parameters, the output of DM 11 is not required to change sign during a synthesis cycle, so a two quadrant digital multiplier may be used, simplifying the design and reducing the complexity of DM 11.

The design of digital adders such as adder 3 is well known to those skilled in the art of digital design. Noise from DAC 5 will contribute directly to the phase noise of the synthesizer, so its design must be carefully considered to minimize noise and spurious signals in its output.

LPF 6 may be realized with on chip components like transconductance-capacitance ("gm-C") filters or with external components, or combinations of on and off chip components. Noise generated in LPF 6 will contribute to the phase noise of the synthesizer, so its design must be carefully considered for optimum phase noise performance of the system.

When the system is in lock, the output from adder 3 should not vary with time, except to correct small perturbations in the output frequency Fo of CCO 7. This implies that the output from DM 11 must be the negative of the output from counter 2. This can be accomplished in any of several ways, such as changing the type of counter 2, or utilizing a multiplying factor M in DM 11 which is negative.

CCO 7 can have multiple outputs, in approximate fixed phase relationship to each other, convenient for driving separate mixers to generate, for example, baseband channels in quadrature.[2] CCO 7 can be implemented with both analog and digital inputs, thus reducing the analog control sensitivity while maintaining the overall required tuning range. Variable frequency oscillator CCO 7 could also be replaced with a voltage controlled oscillator, using the voltage variable capacitance of a reverse biased diode, for example.

Now consider the details of the frequency divider chain consisting of the serial combination of MMP 8, counter 9, and DM 11. Proper operation is predicated on two conditions:

Condition 1)—The output of counter 9 must have precisely the same repetition frequency as the output of counter 2 when the system is locked. Both are equal to S, the step size frequency.

Condition 2)—The number sequence from DM 11 must progress over the negative of the sequence from counter 2.

From Condition 1), Fo/(Lav*N)=S, where Lav is the average value of L over the synthesis cycle (16.666 for the example shown). From Condition 2), the multiplication factor M=k/N. FIG. 2 shows the outputs from counter 2 (C) and counter 9 (A) necessary to meet Condition 1) for Fo=1 GHz, counter 9 modulus=60, MMP 8 having modulus=16 for twenty of the sixty cycles of counter 9 and modulus=17 for forty of the sixty cycles of counter 9. FIG. 2 shows the numerical outputs of the counters in equivalent analog form, as though an ideal digital to analog converter were attached to monitor the outputs of the counters and the results displayed against time on an oscilloscope. The digital output from counter 9 represents the number of cycles of the output of MMP 8 since the beginning of the synthesis cycle. The frequency of the synthesizer is changed by electronically changing the effective divide ratio between the variable frequency oscillator and the phase detector, by electronically controlling the modulus of the prescaler and the modulus N of the programmable divider.

Since the output of DM 11 is compared with that of counter 2 in adder 3, DM 11 need not operate at a rate exceeding that of counter 2, and can be clocked directly from Reference Oscillator 1. When a Multi Modulus Prescaler, such as MMP 8, is used, the output of adder 3 and subsequently DAC 5 can be held constant over the synthesis cycle by adjusting the multiplication factor M of DM 11 in approximate synchronism with the modulus L of MMP 8. The actual output of counter 9, as shown in FIG. 2, waveform A, follows a slightly different slope depending on the value of modulus L of MMP 8. Fixing multiplication factor M based on the average slope of the output of counter 9 will result in cyclic errors in the output of DAC 3 for some combinations of Fo, N, and L, causing spurious frequency modulation sidebands on the synthesizer output from CCO 7. This effect can be envisioned from FIG. 2, which shows the actual output of counter 9 (waveform A) and the output of counter 9 assuming the average modulus L of MMP 8 (17) could be implemented over the entire synthesis cycle (waveform B). Both traces start at 0 and end at 59, but follow different trajectories over the synthesis cycle. The actual output (A) is larger than the output assuming an average modulus (B) because during the first 20 cycles of counter 9 the modulus is set equal to 16, so the output of counter 9 increases at a rate higher than average. If MMP 8 were controlled so that its modulus was first set equal to 17 for forty cycles of counter 9, then switched to 16 for the remaining 20 cycles of counter 9, the actual output (A) would be less than the output assuming an average modulus (B). By adjusting the multiplication factor during the synthesis cycle, the output of the multiplier can be made more nearly constant. The optimum time to switch the multiplication factor is the time the modulus of MMP 8 is switched, but this is not the only point in the cycle to switch the multiplication factor which will result in lower cyclic error. Another way to reduce cyclic error, without switching the multiplication factor during the synthesis cycle, is to switch the modulus of MMP 8 multiple times during the synthesis cycle, thus preventing the error from accumulating to large values. For example, the modulus could be set equal to 16 for ten cycles, equal to 17 for twenty cycles, equal to 16 for ten cycles, and equal to 17 for twenty cycles of counter 9. This technique will reduce the level and increase the frequency of spurious frequency modulation sidebands.

The combined effect of DF 4 and LPF 6 can be utilized in many ways. LPF 6 can be utilized to provide the attenuation required to eliminate spurious modulation products from CCO 7, relegating to DF 4 the function of phase compensation for loop stability and time response shaping. Alternatively, DF 4 can provide attenuation as well as phase compensation, minimizing the size and cost of LPF 6. The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description but rather by the claims appended hereto.

We claim:

1. A frequency synthesizer comprising:
    A) a variable frequency oscillator completely contained on a single integrated circuit;
    B) first digital counter receiving input from said variable frequency oscillator, comprising;
        i) a digital output that represents the number of cycles of said input since the beginning of the synthesis cycle, and
        ii) means to change the modulus of the counter;
    C) a digital multiplier, receiving input from said first digital counter, comprising:
        i) a digital output that represents the product of the output of said counter and a multiplication factor, and
        ii) means to change said multiplication factor of said multiplier;
    D) a reference oscillator;
    E) second digital counter receiving input from said reference oscillator;
    F) a digital adder comprising;
        i) means for receiving output from said digital multiplier;
        ii) means for receiving output from said second counter;
        iii) an output representing the difference between said digital multiplier output and said second counter output;
    H) a digital filter capable of receiving an output of said digital adder;
    I) a digital to analog converter which receives a digital output from said digital filter and provides an analog output; and
    J) a low pass filter which receives the output from said digital to analog converter and drives said variable frequency oscillator.

2. A frequency synthesizer according to claim 1, wherein a multiple modulus prescaler is interposed between said variable frequency oscillator and said first digital counter wherein said multiple modulus prescaler receives input from said variable frequency oscillator and said first digital counter receives input from said multiple modulus prescaler.

3. A frequency synthesizer according to claim 1 wherein said variable frequency oscillator provides multiple outputs whose relative phases are approximately constant.

4. A frequency synthesizer according to claim 1 wherein said variable frequency oscillator takes both digital and analog inputs for frequency control.

5. A frequency synthesizer according to claim 1 wherein said variable frequency oscillator comprises a current controlled oscillator.

6. A frequency synthesizer according to claim 2 wherein said variable frequency oscillator comprises a current controlled oscillator.

7. A frequency synthesizer according to claim 2 wherein said variable frequency oscillator provides multiple outputs whose relative phases are approximately constant.

8. A frequency synthesizer according to claim 2 wherein said variable frequency oscillator takes both digital and analog inputs for frequency control.

9. A frequency synthesizer according to claim 2 wherein said variable frequency oscillator comprises a current controlled oscillator wherein said modulus of said multiple modulus prescaler is changed more than one time during said synthesis cycle.

10. A frequency synthesizer according to claim 2 wherein said modulus of said multiple modulus prescaler is changed more than one time during said synthesis cycle.

* * * * *